United States Patent [19]

Minami et al.

[11] Patent Number: 5,063,305
[45] Date of Patent: * Nov. 5, 1991

[54] CURRENT MIRROR AMPLIFIER CIRCUIT

[75] Inventors: Hiroshi Minami; Koreaki Fujita, both of Itami, Japan

[73] Assignee: Mitsubishi Denki Kabushik Kaisha, Tokyo, Japan

[*] Notice: The portion of the term of this patent subsequent to Aug. 30, 2005 has been disclaimed.

[21] Appl. No.: 338,896

[22] Filed: Apr. 14, 1989

Related U.S. Application Data

[60] Division of Ser. No. 218,888, Jul. 14, 1988, Pat. No. 4,907,201, which is a continuation of Ser. No. 46,509, May 6, 1987, Pat. No. 4,767,942.

[30] Foreign Application Priority Data

May 7, 1986 [JP] Japan ............................ 61-104292

[51] Int. Cl.$^5$ .................. H03K 3/01; H03K 3/353; H03F 3/45
[52] U.S. Cl. .................. 307/304; 307/296.4; 330/257; 330/288
[58] Field of Search .................. 307/297, 296.4, 304; 350/257, 288

[56] References Cited

U.S. PATENT DOCUMENTS 4,767,942 8/1988 Minami et al. .................. 307/304
4,825,418 4/1989 Itoh et al. .................. 365/207

Primary Examiner—Stanley D. Miller
Assistant Examiner—Margaret Rose Wambach
Attorney, Agent, or Firm—Sterne, Kessler, Goldstein & Fox

[57] ABSTRACT

In a MOS transistor circuit (comprising a pair of current mirror circuits, each comprising: first and second MOS transistors having their gate electrodes connected together third and fourth MOS transistors respectively connected in series with the first and second transistors, the third and the fourth MOS transistors of the pair of current mirror circuits receiving a pair of complementary signals at their gate electrodes; and the nodes between the second and the fourth MOS transistors forming output nodes of the current mirror circuits), a pair of capacitors each coupling the output of one current mirror circuit to the gate electrodes of the first and the second MOS transistors of the other current mirror circuit. This provides positive feedback. The change in the outputs responsive to change in the inputs is thereby accelerated.

4 Claims, 2 Drawing Sheets

WITH COUPLING CAPACITORS

WITHOUT COUPLING CAPACITORS

CURRENT MIRROR AMPLIFIER CIRCUIT

This is a division of Ser. No. 218,888, filed July 14, 1988, now U.S. Pat. No. 4,907,201 which is a continuation of Ser. No. 046,509, filed May 6, 1987, now U.S. Pat. No. 4,767,942.

BACKGROUND OF THE INVENTION

The present invention relates to MOS (metal oxide semiconductor) transistor circuits, particularly those having a current mirror voltage amplifier circuit.

An example of a MOS transistor circuit comprising two current mirror voltage amplifier circuits is shown in FIG. 1. A first one, shown as call-out 1, of the current mirror voltage amplifier circuits comprises PMOS (P-channel MOS) transistors TP1 and TP2, and NMOS (N-channel MOS) transistors TN1 and TN2. A second one, shown as call-out 2, of the current mirror voltage amplifier circuits comprises PMOS transistors TP3 and TP4, and NMOS transistors TN3 and TN4. Each of the MOS transistors comprises first and second main electrodes and a gate electrode.

The PMOS transistors TP1 to TP4 have their first main electrodes connected to a power supply V, and their second main electrodes connected to the first main electrodes of the NMOS transistors TN1 to TN4. The transistors TP1 and TP2 have their gate electrodes connected to each other and to the first main electrode of the transistor TN1. The transistors TP3 and TP4 have their gate electrodes connected to the first main electrode of the transistor TN3. The NMOS transistors TN1 to TN4 have their second main electrodes connected to the ground G. The transistors TN1 and TN2 have their gate electrodes connected the gate electrodes of the transistors TN4 and TN3, respectively. The transistors TN1 and TN4 have their gate electrodes connected to a first input signal line N5, while the transistors TN2 and TN3 have their gate electrodes connected to a second input signal line N6, the transistors TN2 and TN4 have their gate electrodes connected to a first and a second output signal lines N7 and N8.

The operation of the circuit will now be described. Initially, the input signal lines N5 and N6 are in an intermediate state, i.e., the input signals are neither at "H" nor "L" for the transistors TN1 to TN4. Assume for instance, the potential on the signal line N5 slightly rises and the potential on the signal line N6 slightly falls. In the first current mirror circuit 1 comprising the transistors TP1, TP2, TN1 and TN2, the NMOS transistor TN1 becomes slightly "ON", and the current from a node N1 to the ground G slightly increases, and the potential on the node N1 slightly falls. The PMOS transistors TP1 and TP2 become slightly ON, and a current flows to a node N2. But the NMOS transistor TN2 is in a slightly "OFF" state, so that the potential on the node N2 rises. The output signal line N7 therefore becomes "H".

In the second current mirror circuit 2 comprising the transistors TP3, TP4, TN3 and TN4, the NMOS transistor TN3 becomes slightly "OFF", and a current from a node N3 to the ground G slightly decreases, and the potential on the node N3 slightly rises. The PMOS transistors TP3 and TP4 becomes slightly "OFF", and a current flowing to a node N4 decreases. But the NMOS transistors TN4 is in a slightly "ON" state, so that the current from the node N4 to the ground G increases, and the potential on the node N4 falls. The output signal line N8 therefore becomes "L".

Thus the two current mirror circuits 1 and 2 operate independently of each other.

The above-described MOS transistor circuit has been used as a high-speed voltage amplifier circuit in a semiconductor memory device and the like. But today an amplifier circuit with even higher speed is desired.

SUMMARY OF THE INVENTION

An object of the invention is to provide a MOS transistor circuit capable of voltage amplification at a higher speed than before.

A MOS transistor circuit according to the invention comprises a pair of current mirror voltage amplifier circuits, generally similar to that described above, but distinguished by capacitive coupling of the output of each current mirror voltage amplifier circuit to the gate electrodes of the MOS transistors of the other current mirror voltage amplifier circuit that are connected to each other.

Because of the capacitive coupling, the output signal of each current mirror voltage amplifier circuit is transmitted to gate electrodes of the MOS transistors which determine the current through the respective MOS transistors. Application of the output to the gate electrodes accelerates the change in the currents and hence in the outputs. In other words the capacitive coupling provides a path for positive feedback. Accordingly, the voltage amplification is made at a higher speed.

DESCRIPTION OF THE PREFERRED EMBODIMENTS

Figure 1:
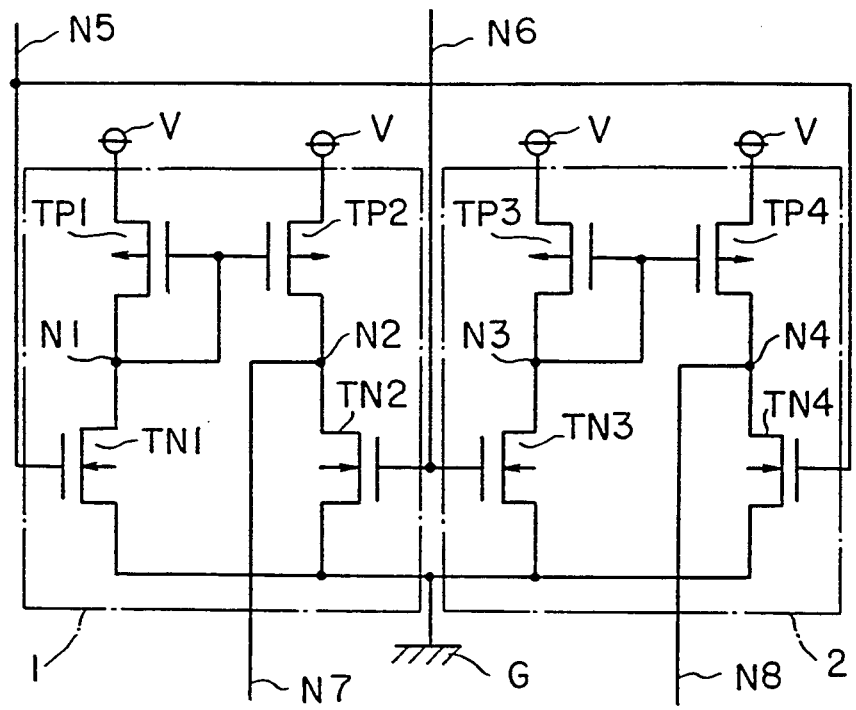
FIG. 1 is a circuit diagram showing a conventional MOS transistor circuit having current mirror amplifier circuits.
Figure 2:
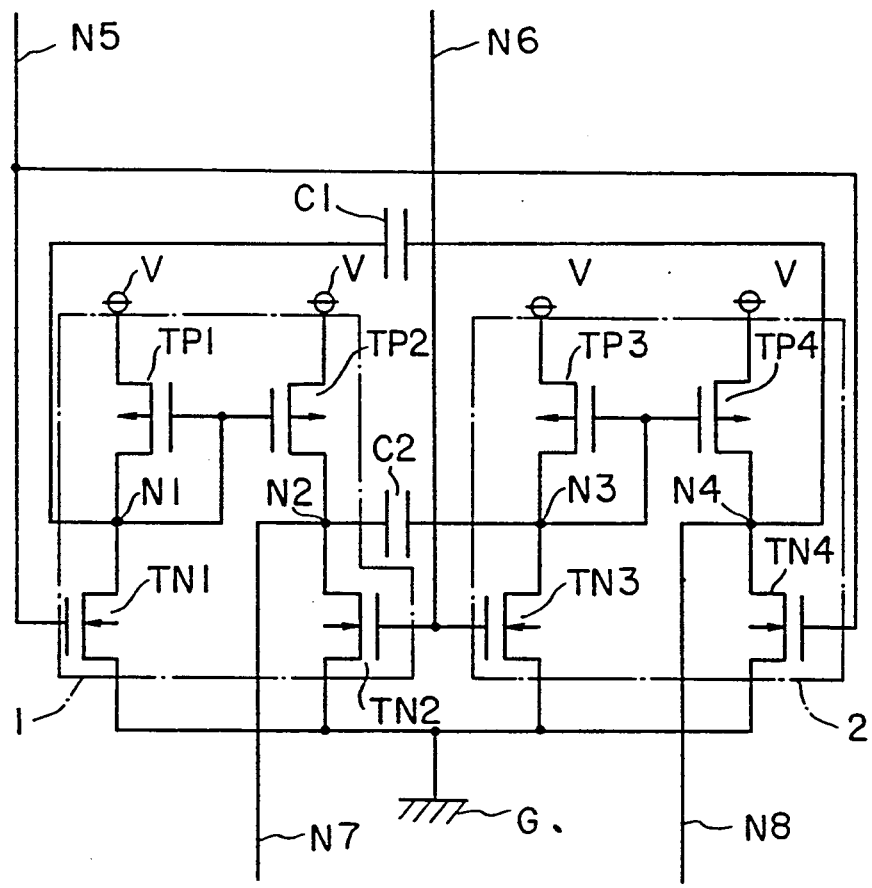
FIG. 2 is a MOS transistor circuit of an embodiment of the invention.

FIG. 2 shows a MOS transistor circuit having voltage amplifier circuits according to an embodiment of the invention. In the figure, reference numerals identical to those in FIG. 1 denote identical or similar components. The circuit configuration of FIG. 2 is generally identical to that of FIG. 1. But the circuit of FIG. 2 differs from the circuit of FIG. 1 in that it comprises a capacitor C1 coupling the first main electrode of the NMOS transistor TN4 with the gate electrodes of the PMOS transistors TP1 and TP2, and a capacitor C2 coupling the first main electrode of the NMOS transistor TN2 with the gate electrodes of the PMOS transistors TP3 and TP4. In other words, each of the capacitors C1 and C2 are connected to couple an output N4 or N2 of one of the current mirror amplifier circuits to the interconnected gate electrodes of the PMOS transistors of the other current mirror amplifier circuit.

Initially, the input signal lines N5 and N6 are in an intermediate state, i.e., the input signals are at a level which is neither at "H" nor "L" for the transistors TN1 to TN4.

Assume that the potential on the input signal line N5 slightly rises and the potential on the input signal line N6 slightly falls.

In the first current mirror circuit 1 comprising the transistors TP1, TP2, TN1 and TN2, the NMOS transistor TN1 becomes slightly "ON" and the current from the node N1 to the ground G increases, and the potential on the node N1 falls, as described with reference to FIG. 1.

In the circuit of FIG. 2, there is an additional contribution to the falling of the potential on the node N1. That is falling of the potential on the node N4, i.e., the output of the second current mirror circuit 2, contributed, by virtue of the capacitor C1 coupling the nodes N4 to N1, to the falling of the potential on the node N1. Such contribution accelerates the falling of the potential on the node N1. Thus the falling of the potential on the node N1 is quicker than in the prior art of FIG. 1. The circuit of FIG. 2 is therefore quicker than the circuit of FIG. 1 in the operations, by which the PMOS transistor TP1 and TP2 becomes "ON" and a current flows to the node N2, and with the NMOS transistor TN2 being slightly "OFF", the potential on the node N7 rises and the output signal line N7 become "H".

The second current mirror circuit 2 comprising the transistors TP3, TP4, TN3 and TN4 operate in a similar manner. The voltage amplification function is thereby improved.

Figure 3A:
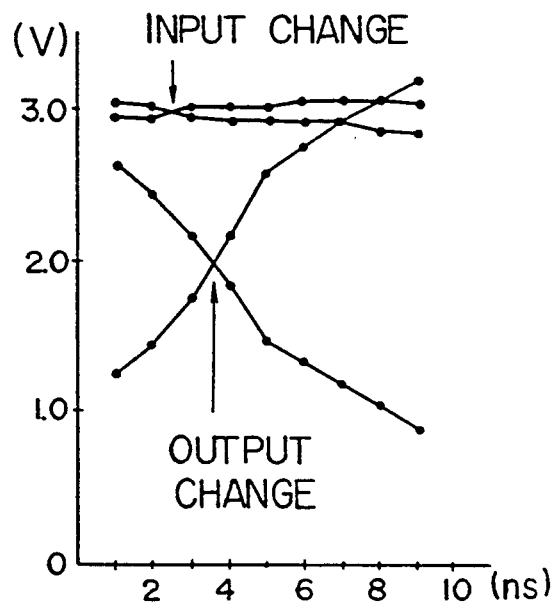
FIGS. 3a and 3b are waveform diagrams obtained by simulating the circuit of the embodiment and the conventional circuit.
Figure 3B:
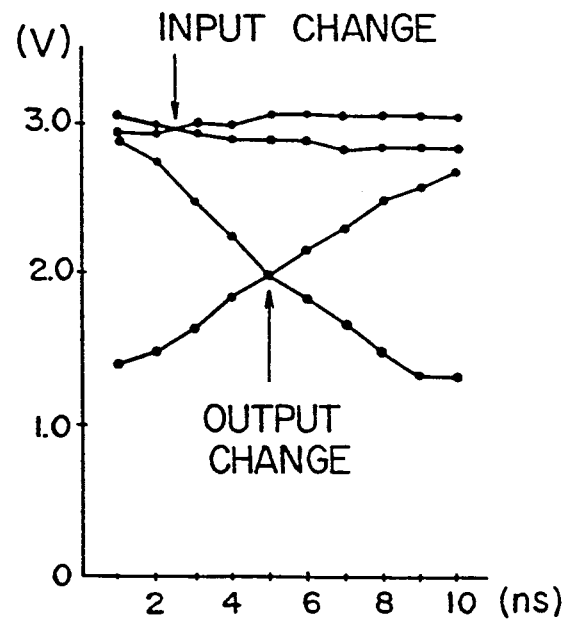

FIGS. 3a and 3b are wave form diagrams which were obtained by simulating the circuit of the embodiment with the capacitors and the conventional circuit without the capacitors. It was assumed that the power supply voltage is 4.5V, the capacitors C1 and C2 are 3.0 pF, and the parameters of the respective semiconductor elements are as shown below:

|  | CHANNEL LENGTH L (microns) | CHANNEL WIDTH W (microns) |
| --- | --- | --- |
| TP1, TP3 | 2.0 | 10.5 |
| TP2, TP4 | 2.0 | 21.0 |
| TN1, TN3 | 1.5 | 3.5 |
| TN2, TN4 | 1.5 | 7.0 |

The gate capacitance was $1.456 \times 10^{-3}$ pF/micrometers$^2$ in each case.

It will be seen from FIGS. 3a and 3b, that the time lag from the input change to output change has been reduced by 60% by the improvement of the embodiment of FIG. 2.

The circuit shown in FIG. 2 can be incorporated in a sense amplifier for a static RAM to receive, on the first and the second input signal lines, complementary signals from a memory cell. An example of such a sense amplifier is shown in the U.S. Pat. No. 4,509,147, disclosure thereof being incorporated herein by reference. The circuit of FIG. 2 of the present application can be used in substitution for the circuits P1 and P2 shown in FIG. 6 of the above-referenced U.S. Patent.

In the embodiments described and shown in the drawing figures, in a pair of current mirror circuits the capacitor C1 is connected to couple the nodes N1 and N4, and the capacitor C2 is connected to couple the nodes N2 and N3. Thus, each output node N2 and N4 is capacitively coupled to a node within the pair of current mirror circuits undergoing the same tendency of potential change, due to the function of the pair of current mirror circuits, so that where the gate inputs to the input MOS transistors of the current mirror circuits are in opposite phases, the potential changes on the output nodes are effectively "assisted" by the above mentioned node undergoing the same potential change, and the time required for the amplification can be reduced.

What is claimed is:

1. A transistor circuit, comprising:
first and second voltage amplifier circuits, each including:
first and second active loads;
a first field-effect drive transistor, connected to pull current through said first active load, and a second field-effect drive transistor, connected to pull current through said second active load;
said first drive transistor and said first active load being connected at a first node, which is also connected to regulate the impedance of said second active load;
said second drive transistor and said second active load being connected at a second node, which is also connected to provide an output signal of said voltage amplifier;
a first input signal being connected to said first drive transistor of said first amplifier and to said second drive transistor of said second amplifier, and a second input signal being connected to said second drive transistor of said first amplifier and to said first drive transistor of said second amplifier;
said second node of said first voltage amplifier being coupled to partially drive said first node of said second voltage amplifier, and said second node of said second voltage amplifier being coupled to partially drive said first node of said first voltage amplifier.

2. A CMOS circuit, comprising:
first and second voltage amplifier circuits, each including:
first and second pull-up devices, and first and second pull-down devices;
said first pull-up and pull-down devices being connected at a first node, which is also connected to the gate of said second pull-up device;
said second pull-up and pull-down devices being connected at a second node, which is also connected to provide an output signal of said respective voltage amplifier;
a first input signal being connected to said first pull-down device of said first amplifier and to said second pull-down device of said second amplifier, and a second input signal being connected to said second pull-down device of said first amplifier and to said first pull-down device of said second amplifier;
said second node of said first voltage amplifier being coupled to partially drive said first node of said second voltage amplifier, and said second node of said second voltage amplifier being coupled to partially drive said first node of said first voltage amplifier.

3. A MOS transistor circuit comprising:
a first current-mirror circuit comprising:
a first, P-type MOS semiconductor device having a first electrode connected to a first power supply line, a second electrode, and a gate electrode connected to said second electrode,
a second, P-type MOS semiconductor device having a first electrode connected to said first power supply line, a second electrode connected to a first output signal line, and a gate electrode connected to said second electrode of said first semiconductor device, a third, N-type MOS semiconductor device having a first electrode connected to said second electrode of said first semiconductor device, and a second electrode connected to said second power supply line, and a fourth, N-type MOS semiconductor device connected to said first output signal line, and a second electrode connected to said second power supply line, a second current-mirror circuit comprising:

a fifth, P-type MOS semiconductor device having a first electrode connected to said first power supply line, a second electrode, and a gate electrode connected to said second electrode, sixth, P-type MOS semiconductor device having a first electrode connected to said first power supply line, a second electrode connected to a second output signal line, and a gate electrode connected to said second electrode of said fifth semiconductor device, a seventh, N-type MOS semiconductor device having a first electrode connected to said second electrode of said fifth semiconductor device, and a second electrode connected to said second power supply line, and an eighth, N-type MOS semiconductor device connected to said second output signal line, and a second electrode connected to said second power supply line, a first input signal line connected to said gate electrodes of said third and eighth semiconductor devices, a second input signal line connected to said gate electrodes of said fourth and seventh semiconductor devices, a first capacitor connected to couple said second electrode of said sixth semiconductor device, and a first node, within said current mirror circuits, undergoing the same potential change as said second electrode of said sixth semiconductor device, and a second capacitor connected to couple said second electrode of said second semiconductor device, and a second node, within said current mirror circuits, undergoing the same potential change as said second electrode of said second semiconductor device.

4. A circuit according to claim 3, wherein said semiconductor devices are field effect transistors.

* * * * *